(12) United States Patent
Kim

(10) Patent No.: US 7,323,655 B2
(45) Date of Patent: Jan. 29, 2008

(54) INDUCTIVELY COUPLED PLASMA REACTOR FOR PRODUCING NANO-POWDER

(75) Inventor: Young-nam Kim, Daejeon (KR)

(73) Assignee: Nano Plasma Center Co., Ltd. (KR)

( * ) Notice: Subject to any disclaimer, the term of this patent is extended or adjusted under 35 U.S.C. 154(b) by 306 days.

(21) Appl. No.: 10/514,692

(22) PCT Filed: Feb. 25, 2003

(86) PCT No.: PCT/KR03/00375

§ 371 (c)(1),
(2), (4) Date: Nov. 17, 2004

(87) PCT Pub. No.: WO03/097521

PCT Pub. Date: Nov. 27, 2003

(65) Prior Publication Data

US 2005/0258766 A1 Nov. 24, 2005

(30) Foreign Application Priority Data

May 17, 2002 (KR) .................. 10-2002-0027253

(51) Int. Cl.
*B23K 10/00* (2006.01)
(52) U.S. Cl. .................. 219/121.43; 219/121.48; 315/111.51; 156/345.21; 118/723 R
(58) Field of Classification Search ............ 219/121.5, 219/121.36, 121.59, 121.48, 121.52, 121.37; 118/723 R; 315/111.57; 156/345.21

See application file for complete search history.

(56) References Cited

U.S. PATENT DOCUMENTS 4,812,166 A * 3/1989 Saiki et al. .................. 75/346

(Continued)

FOREIGN PATENT DOCUMENTS

JP 56-58537 5/1981

(Continued)

OTHER PUBLICATIONS

PCT International Search Report; International Application No. PCT/KR03/00375; International filing date: Feb. 25, 2003; Date of Mailing : Jun. 19, 2003.

(Continued)

*Primary Examiner*—Mark Paschall
(74) *Attorney, Agent, or Firm*—Cantor Colburn LLP

(57) ABSTRACT

Disclosed herein is a high-frequency induction plasma reactor apparatus for producing nano-powder, which is configured to continuously manufacture nano-powder in large quantities using solid-phase powder as a starting raw material and to manufacture high-purity nano-powder by completely vaporizing the material powder. The high-frequency induction plasma reactor apparatus comprises an upper body and a cover. The upper body is provided with a reaction pipe receiving a reactor extending vertically inside thereof, a high-frequency coil surrounding the outer periphery of the reaction pipe and a ceramic inner wall provided inside the reaction pipe. The ceramic inner wall is formed with a plurality of gas passing bores and defines a gas movement passage with the inner side wall of the reaction pipe therebetween for allowing the inflow of argon gas from the outside into the reactor. The cover is mounted to the upper end of the reactor and adapted to seal the reactor. The cover is provided with a powder injection tube communicating with the reactor.

16 Claims, 4 Drawing Sheets

U.S. PATENT DOCUMENTS 5,792,272 A * 8/1998 van Os et al. ........... 118/723 R
2002/0185226 A1 * 12/2002 Lea et al. .............. 156/345.35

FOREIGN PATENT DOCUMENTS

JP          4-305355        10/1992
KR       2002-0025101        4/2002
WO        WO 99/26267        5/1999

OTHER PUBLICATIONS

PCT International Preliminary Examination Report; International Application No. PCT/KR2003/000375; International filing date: Feb. 25, 2003; Date of Completion : Sep. 10, 2004.

* cited by examiner

INDUCTIVELY COUPLED PLASMA REACTOR FOR PRODUCING NANO-POWDER

TECHNICAL FIELD

The present invention relates generally to a plasma reactor apparatus for producing nano-powder at atmospheric pressure using high-frequency coils. More specifically, the present invention relates to a high-frequency induction plasma reactor apparatus for producing nano-powder, which is configured to continuously manufacture nano-powder in large quantities using solid-phase powder as a starting raw material and to manufacture high-purity nano-powder by completely vaporizing the raw material powder.

BACKGROUND ART

Generally, a nano-powder producing reactor is referred to an apparatus for manufacturing nano-powder by vaporizing gas-phase or liquid-phase materials as raw materials. The nano-powder manufactured using the reactor is input into and collected in a separate collecting device.

A conventional reactor produces nano-powder by implementing ionization and dissociation of reactants, using plasma torches of direct-current type, high-frequency type, direct-current/high-frequency type and so on. Specifically, the reactor attains nano-powder by generating plasma arc columns between electrodes of the plasma torches and maintaining the plasma arc columns continuously.

In the conventional reactor, however, several problems may be encountered while using it. One recurring problem is that the conventional reactor is configured to use only gas-phase or liquid-phase material as a starting raw material and thus solid-phase material is not allowed in the manufacture of nano-powder. This makes the continuous mass production of nano-powder impossible.

Another shortcoming of the conventional reactor is a limitation of applicable materials. In the conventional reactor, because of explosive reaction and powder adsorption problems caused by water vapor contained in the reactor, only non-reactive oxide based materials (for example, alumina and so on) are acceptable.

Further, the conventional reactor is unable to control plasma because the reactor has no separate plasma control device.

Finally, the moisture content percentage within the conventional reactor is insufficient. This is fundamentally attributable to a low space utility of the reactor. In the case of the conventional reactor, only a space between the electrodes of plasma torches, instead of the overall space of the reactor, is usable.

DISCLOSURE OF THE INVENTION

Therefore, the present invention has been made in view of the above problems, and it is an object of the present invention to provide a high-frequency induction plasma reactor apparatus for producing nano-powder, which is configured to manufacture high-purity nano-powder by vaporizing solid-phase material powder, using high-frequency induction heat at atmospheric pressure.

It is another object of the present invention to provide a high-frequency induction plasma reactor apparatus having upper and lower reactors arranged in two stages, the lower reactor having a temperature and capacity larger than those of the upper reactor, thereby enabling the complete vaporization of material powder.

It is further another object of the present invention to provide a high-frequency induction plasma reactor apparatus, which is configured to prevent the growth and adsorption of vaporized nano-powder via the inflow of cryogenic coolant (i.e. argon gas) into the reactor.

It is another object of the present invention to provide a high-frequency induction plasma reactor apparatus, which is configured to helically guide coolant gas into the reactor, thereby safely moving molten and vaporized nano-powder to a collecting station via the helical motion thereof without agglomeration.

It is yet another object of the present invention to provide a high-frequency induction plasma reactor apparatus, which is configured to prevent plasma from being adsorbed to the inner wall of the reactor, using permanent magnets mounted around the periphery of the reactor.

In accordance with the present invention, the above and other objects can be accomplished by the provision of a plasma reactor apparatus for producing nano-powder comprising: an upper body having a reaction pipe receiving a reactor extending vertically inside thereof, a high-frequency coil surrounding the outer periphery of the reaction pipe, and a ceramic inner wall provided inside the reaction pipe, the ceramic inner wall being formed with a plurality of gas passing bores and defining gas movement passage with the reaction pipe there between for allowing the inflow of argon gas from the outside into the reactor; and a cover mounted to an upper end of the reactor and adapted to seal the reactor, the cover being provided with a powder injection tube communicating with the reactor; wherein the upper body is provided with a permanent magnet assembly around the periphery of the high-frequency coil, the magnet assembly comprising a plurality of permanent magnets uniformly combined by fixing means and having inner ends of the same polarity as one another so that they compress plasma inside the reactor, thereby preventing the plasma from being adsorbed to the wall of the reactor.

Preferably, the plasma reactor apparatus for producing nano-powder may further comprise a lower body mounted under the upper body, the lower body having a reaction pipe receiving a reactor communicating with the reactor of the upper body, a high-frequency coil surrounding the outer periphery of the reaction pipe, and a ceramic inner wall provided inside the reaction pipe, the reactor of the lower body having a diameter larger than that of the reactor of the upper body, the high frequency coil of the lower body having a capacity larger than that of the high frequency coil of the upper body, the ceramic inner wall being formed with a plurality of gas passing bores and defining a gas movement passage with the reaction pipe therebetween.

BRIEF DESCRIPTION OF THE DRAWINGS

The above and other objects, features and other advantages of the present invention will be more clearly understood from the following detailed description taken in conjunction with the accompanying drawings, in which.

BEST MODE FOR CARRYING OUT THE INVENTION

Figure 1:
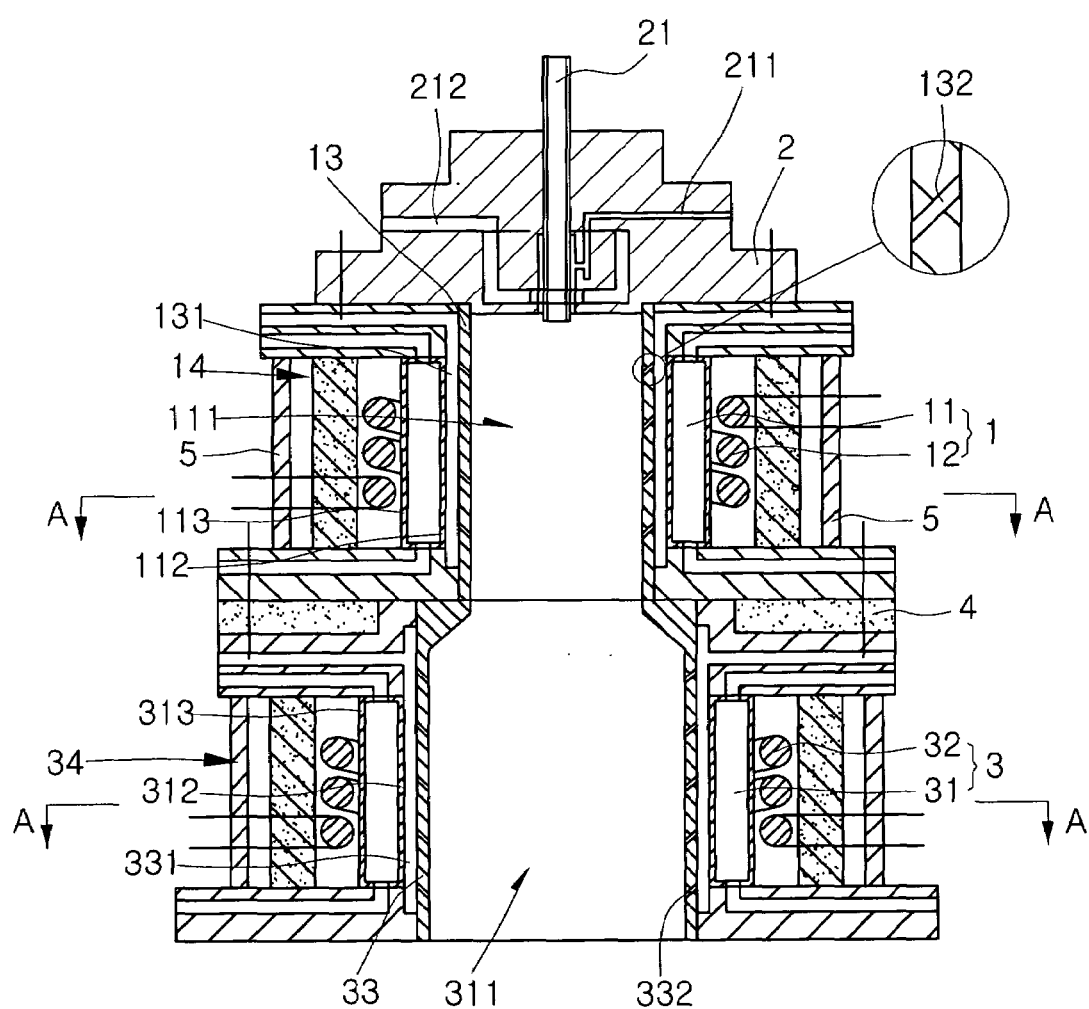
FIG. 1 is a sectional view illustrating a plasma reactor apparatus in accordance with the present invention.
Figure 2:
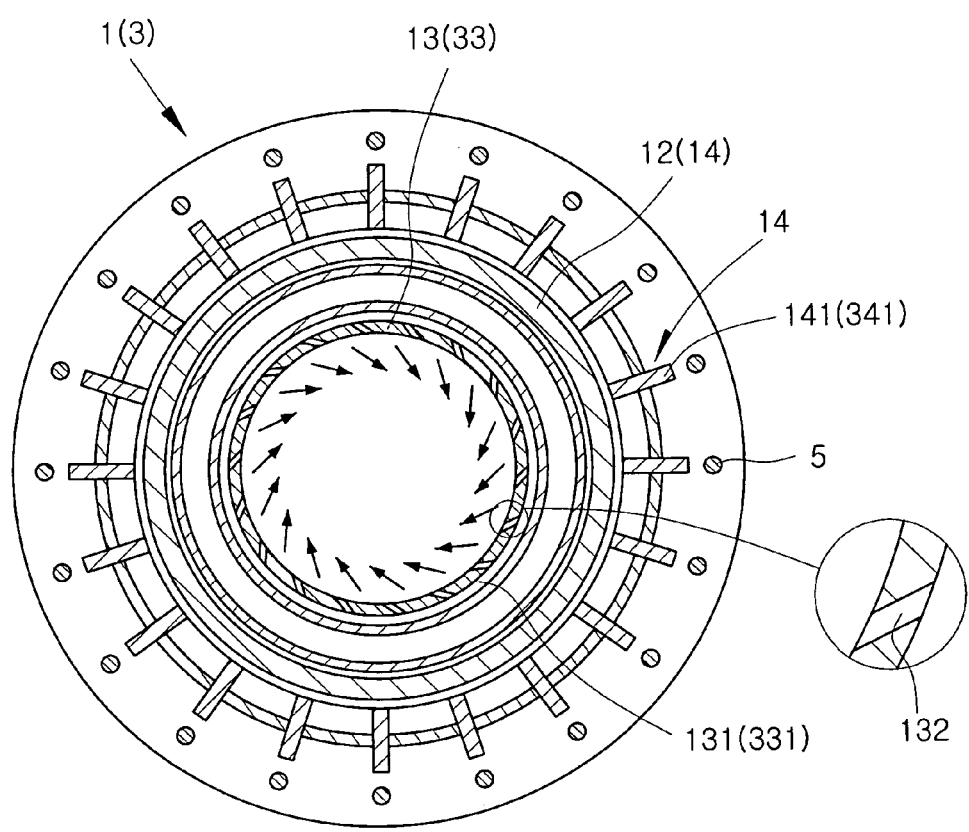
FIG. 2 is a cross sectional view taken along the line A-A of FIG. 1.

FIG. 1 is a sectional view illustrating a plasma reactor apparatus in accordance with the present invention, and FIG. 2 is a cross sectional view taken along the line A-A of FIG. 1. First, the configuration of a plasma reactor apparatus will be described.

Referring to FIGS. 1 and 2, a plasma reactor apparatus of the present invention comprises an upper body 1, a cover 2, and a lower body 3. The upper body 1 is provided with a reaction pipe 11 receiving a reactor 111 extending vertically inside thereof, and a high-frequency coil 12 surrounding the outer periphery of the reaction pipe 11. The cover 2 is mounted to the upper end of the reactor 111 and adapted to seal the reactor 111. The cover 2 has a powder injection tube 21 communicating with the reactor 111 to inject material powder into the reactor 111.

The lower body 3, located under the upper body 2, is provided with a reaction pipe 31 receiving a reactor 311 extending vertically inside thereof, and a high-frequency coil 32 surrounding the outer periphery of the reaction pipe 31. The reactor 311 of the lower body 3 has a diameter larger than that of the reactor 111 of the upper body 1, and the high-frequency coil 32 of the lower body 3 has a capacity greater than that of the high-frequency coil 12 of the upper body 1. Thus, the lower body 3 is adapted to completely vaporize the material powder having passed by the reactor 111 of the upper body 1.

The respective upper and lower bodies 1 and 3 are provided with ceramic inner walls 13 and 33, respectively. The respective ceramic inner walls 13 and 33 are formed with a plurality of gas passing bores 132 and 332, respectively, and define gas movement passages 131 and 331 with the respective reaction pipes 11 and 31, respectively.

The respective reaction pipes 11 and 31 of the upper body 1 and lower body 3 have ceramic inner and outer side walls 112 and 113, and 312 and 313, respectively. The reaction pipes 11 and 31 are adapted to receive water from the outside and circulate the water therein, thereby cooling the inner side walls 112 and 312 thereof.

The cover 2 is provided with a gas inflow canal 211 for allowing the inflow of argon gas from the outside. The gas inflow canals 211 communicates with the powder injection tube 21. The cover 2 is also provided therein with a cooling tube 212 arranged adjacent to the lower surface of the cover 2. The cooling tube 212 is adapted to receive cooling water from the outside. The cooling water is used to cool the lower surface of the cover 2.

The upper body 1 and lower body 3 are provided with insulators 4 between their adjacent connecting ends facing each other. The insulators 4 serve to prevent the conduction of heat toward the upper and lower bodies 1 and 3.

In addition, the upper body 1 and lower body 3 are provided with a plurality of insulating bars 5 arranged uniformly around their outer peripheries, respectively. The insulating bars 5 serve to protect the reaction pipes 11 and 31 and high-frequency coils 12 and 32.

Now, the operation of the plasma reactor apparatus will be described in reference to FIGS. 1 and 2.

When electric power is supplied to the respective high-frequency coils 12 and 32 of the upper body 1 and lower body 3, due to high frequencies emitted from the respective high-frequency coils 12 and 32, the temperatures of the respective reactors 111 and 311 of the upper body 1 and lower body 3 are raised. In this case, since the high-frequency coil 32 of the lower body 3 has a capacity larger than that of the high-frequency coil 12 of the upper body 1, the reactor 311 of the lower body 3 is adapted to maintain a high temperature relative to the reactor 111 of the upper body 1.

Then, the material powder having a large particle size is input into the reactor 111 formed inside the reaction pipe 11 of the upper body 1 through the powder injection tube 21 formed to penetrate the central vertical axis of the cover 2.

The input material powder inside the reactor 111 of the upper body 1 is melted and vaporized due to the high temperature of the reactor 111. According to this vaporization of the material powder, gas containing nano-powder is obtained.

Upon completion of vaporization in the reactor 111 of the upper body 1, however, a part of the gas is not vaporized completely, and remains in a molten state. This molten material falls into the reactor 311 of the lower body 3, and then is re-heated and vaporized in the reactor 311.

Since the reactor 311 of the lower body 3 has a higher temperature than the reactor 111 of the upper body 1, the non-vaporized molten material having passed through the reactor 111 of the upper body can be vaporized completely in the reactor 311 of the lower body 3.

Hereinafter, details of the present invention will be explained.

Figure 3:
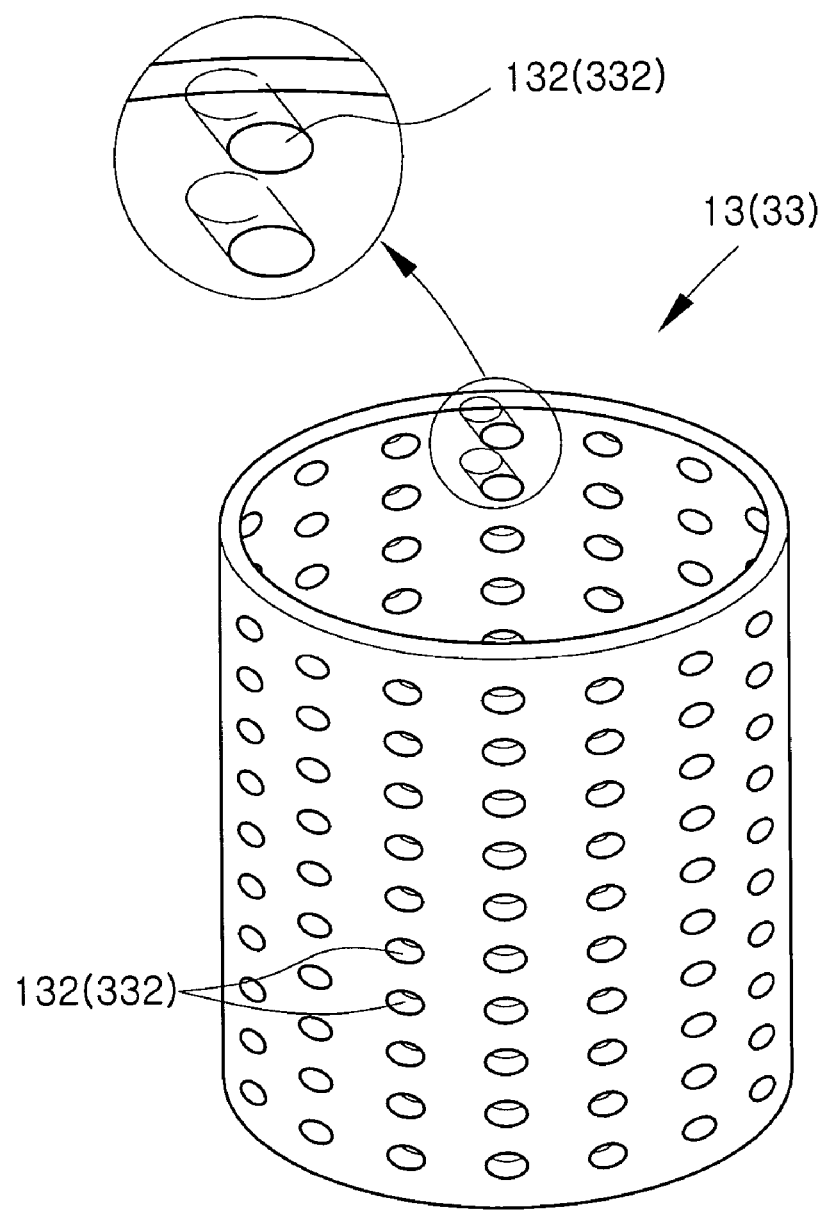
FIG. 3 is perspective view illustrating a ceramic inner wall in accordance with the present invention.

As shown in FIGS. 1 to 3, the respective ceramic inner walls 13 and 33 are formed with a plurality of gas passing bores 132 and 332, respectively, and define the respective gas movement passages 131 and 331 with the respective inner side walls 112 and 312 of the reaction pipes 11 and 31.

The gas passing bores 132 and 332 extend diagonally through the inner walls 13 and 33 so that their outlets are inclined laterally and downwardly relative to their inlets. Because of this diagonal orientation of the gas passing bores 132 and 332, the inflow outside gas, namely, the argon gas, creates a helical eddy current within the reactors 111 and 311.

The argon gas first is supplied from the outside into the gas movement passages 131 and 331 and then injected through the gas passing bores 132 and 332 of the inner walls 13 and 33 into the reactors 111 and 311 while forming a helical eddy current.

The molten and vaporized powder passes successively through the reactor 111 of the upper body 1 and the reactor 311 of the lower body 3 while forming a helical eddy current, and then falls into a collecting device.

The swirling movement of the powder prevents the agglomeration and adsorption of the powder to the inner wall of the reactor during its downward movement.

Figure 4:
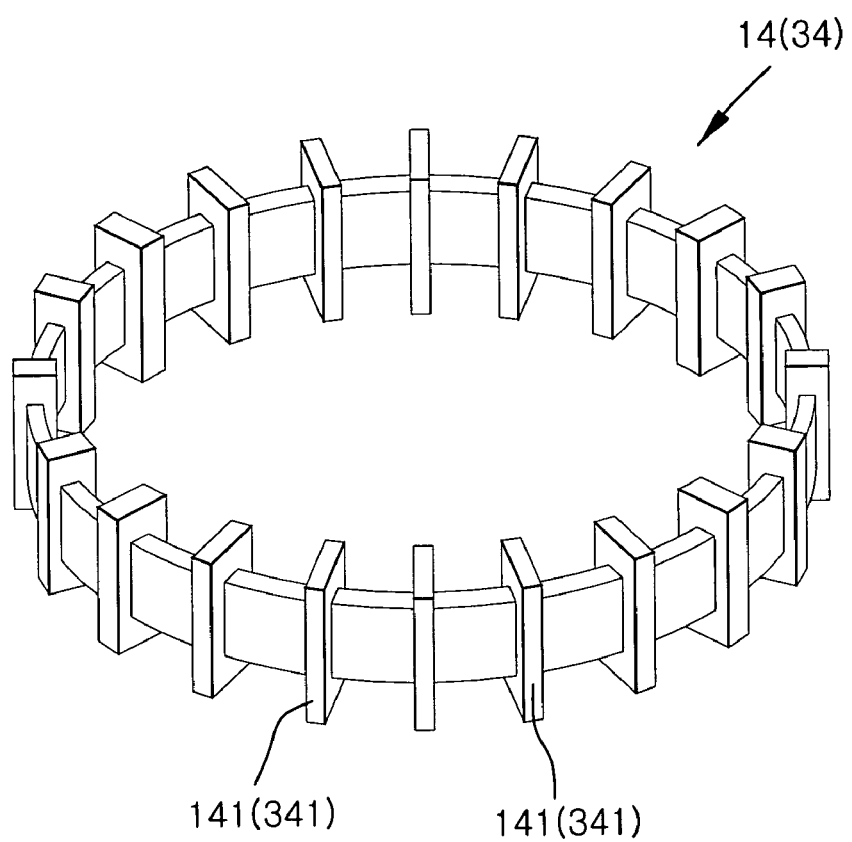
FIG. 4 is a perspective view illustrating permanent magnets in accordance with the present invention.

As shown FIGS. 2 and 4, the respective upper and lower bodies 1 and 3 are provided with respective permanent magnet assemblies 14 and 34 around the peripheries of the high-frequency coils 12 and 32. The respective magnet assemblies 14 and 34 comprise a plurality of permanent magents 141 and 341 fixed with fixing means while being uniformly spaced from one another. The permanent magnets 141 and 341, having inner ends of the same polarity as one another, are adapted to compress the plasma inside the reactors 111 and 311, thereby preventing the plasma from being adsorbed to the inner walls of the reactors 111 and 311.

INDUSTRIAL APPLICABILITY

As apparent from the above description, the present invention provides a high-frequency induction plasma reactor apparatus which is configured to enable the continuous mass production of nano-powder using solid-phase powder as a starting material.

According to the present invention, the high-frequency induction plasma reactor apparatus can manufacture high-purity nano-powder by completely vaporizing material powder supplied into the reactor.

Since the growth and adsorption of vaporized nano-powder is prevented using cryogenic coolant gas (i.e. argon gas) flown into the reactor, certain strongly reactive materials are also applicable.

The high-frequency induction plasma reactor apparatus is configured to helically guide the coolant gas into the reactor, thereby safely moving molten and vaporized nano-powder to a collecting station via the helical motion thereof without agglomeration. It will ensure the stability of production.

The high-frequency induction plasma reactor is configured to prevent plasma from being adsorbed to the inner wall of the reactor, thereby maximizing the manufacturing efficiency of plasma.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

The invention claimed is:

1. A plasma reactor apparatus for producing nano-powder comprising:
    an upper body having a reaction pipe receiving a reactor extending vertically inside thereof, a high-frequency coil surrounding the outer periphery of the reaction pipe, and a ceramic inner wall provided inside the reaction pipe, the ceramic inner wall being formed with a plurality of gas passing bores and defining gas movement passage with the reaction pipe therebetween for allowing the inflow of argon gas from the outside into the reactor; and
    a cover mounted to an upper end of the reactor and adapted to seal the reactor, the cover being provided with a powder injection tube communicating with the reactor;
    wherein the upper body is provided with a permanent magnet assembly around the periphery of the high-frequency coil, the magnet assembly comprising a plurality of permanent magnets uniformly spaced apart from one another and combined by fixing means and having inner ends of the same polarity as one another disposed radially inwardly in contrast to opposite ends thereof being a different polarity and disposed radially outwardly so that they compress plasma inside the reactor, thereby preventing the plasma from being adsorbed to the wall of the reactor.

2. The plasma reactor apparatus for producing nano-powder as set forth in claim 1, wherein the reaction pipe comprises ceramic inner and outer side walls defining a space therebetween, into which water is charged and circulated therein.

3. The plasma reactor apparatus for producing nano-powder as set forth in claim 1, wherein the gas passing bores formed to penetrate through the inner wall are inclined so that an outlet of each gas passing bore is inclined laterally and downwardly from an inlet thereof, thereby creating a helical eddy current of inflow gas having passed through the gas passing bores within the reactor.

4. The plasma reactor apparatus for producing nano-powder as set forth in claim 1, wherein the upper body is provided with a plurality of insulating bars mounted around its outer periphery in order to protect the high-frequency coil and the reaction pipe.

5. The plasma reactor apparatus for producing nano-powder as set forth in claim 1, wherein:
    the cover is provided with a gas inflow canal which communicates the powder injection tube for allowing the inflow of gas from the outside; and
    the cover is also provided therein with a cooling tube arranged adjacent to a lower surface of the cover, the cooling tube being adapted to receive cooling water from the outside, thereby cooling the lower surface of the cover using the cooling water.

6. The plasma reactor apparatus for producing nano-powder as set forth in claim 1, further comprising:
    a lower body mounted under the upper body;
    wherein the lower body having a reaction pipe receiving a reactor communicating with the reactor of the upper body, a high-frequency coil surrounding the periphery of the reaction pipe, and a ceramic inner wall provided inside the reaction pipe, the reactor of the lower body having a diameter larger than that of the reactor of the upper body, the high frequency coil of the lower body having a capacity larger than that of the high frequency coil of the upper body, the ceramic inner wall being formed with a plurality of gas passing bores and defining a gas movement passage with the reaction pipe therebetween for allowing the inflow of argon gas from the outside into the reactor.

7. The plasma reactor apparatus for producing nano-powder as set forth in claim 6, wherein the reaction pipe comprises ceramic inner and outer side walls defining a space therebetween, into which water is charged and circulated therein.

8. The plasma reactor apparatus for producing nano-powder as set forth in claim 6, wherein the gas passing bores formed to penetrate through the inner wall are inclined so that an outlet of each gas passing bore is inclined laterally and downwardly from an inlet thereof, thereby creating a helical eddy current of inflow gas having passed through the gas passing bores within the reactor.

9. The plasma reactor apparatus for producing nano-powder as set forth in claim 1, wherein the lower body is provided with a permanent magnet assembly around the periphery of the high-frequency coil, the magnet assembly comprising a plurality of permanent magnets uniformly combined by fixing means and having inner ends of the same polarity as one another so that they compress plasma inside the reactor, thereby preventing the plasma from being adsorbed to the wall of the reactor.

10. The plasma reactor apparatus for producing nano-powder as set forth in claim 6, wherein the lower body is provided with a plurality of insulating bars mounted around its outer periphery in order to protect the high-frequency coil and the reaction pipe.

11. The plasma reactor apparatus for producing nano-powder as set forth in claim 6, wherein the upper body and lower body are formed with insulators between their adjacent connecting ends facing each other, the insulators serving to prevent the conduction of heat toward the upper and lower bodies.

12. The plasma reactor apparatus for producing nano-powder as set forth in claim 2, further comprising:

a lower body mounted under the upper body;

wherein the lower body having a reaction pipe receiving a reactor communicating with the reactor of the upper body, a high-frequency coil surrounding the periphery of the reaction pipe, and a ceramic inner wall provided inside the reaction pipe, the reactor of the lower body having a diameter larger than that of the reactor of the upper body, the high frequency coil of the lower body having a capacity larger than that of the high frequency coil of the upper body, the ceramic inner wall being formed with a plurality of gas passing bores and defining a gas movement passage with the reaction pipe therebetween for allowing the inflow of argon gas from the outside into the reactor.

13. The plasma reactor apparatus for producing nano-powder as set forth in claim 3, further comprising:

a lower body mounted under the upper body;

wherein the lower body having a reaction pipe receiving a reactor communicating with the reactor of the upper body, a high-frequency coil surrounding the periphery of the reaction pipe, and a ceramic inner wall provided inside the reaction pipe, the reactor of the lower body having a diameter larger than that of the reactor of the upper body, the high frequency coil of the lower body having a capacity larger than that of the high frequency coil of the upper body, the ceramic inner wall being formed with a plurality of gas passing bores and defining a gas movement passage with the reaction pipe therebetween for allowing the inflow of argon gas from the outside into the reactor.

14. The plasma reactor apparatus for producing nano-powder as set forth in claim 1, further comprising:

a lower body mounted under the upper body;

wherein the lower body having a reaction pipe receiving a reactor communicating with the reactor of the upper body, a high-frequency coil surrounding the periphery of the reaction pipe, and a ceramic inner wall provided inside the reaction pipe, the reactor of the lower body having a diameter larger than that of the reactor of the upper body, the high frequency coil of the lower body having a capacity larger than that of the high frequency coil of the upper body, the ceramic inner wall being formed with a plurality of gas passing bores and defining a gas movement passage with the reaction pipe therebetween for allowing the inflow of argon gas from the outside into the reactor.

15. The plasma reactor apparatus for producing nano-powder as set forth in claim 4, further comprising:

a lower body mounted under the upper body;

wherein the lower body having a reaction pipe receiving a reactor communicating with the reactor of the upper body, a high-frequency coil surrounding the periphery of the reaction pipe, and a ceramic inner wall provided inside the reaction pipe, the reactor of the lower body having a diameter larger than that of the reactor of the upper body, the high frequency coil of the lower body having a capacity larger than that of the high frequency coil of the upper body, the ceramic inner wall being formed with a plurality of gas passing bores and defining a gas movement passage with the reaction pipe therebetween for allowing the inflow of argon gas from the outside into the reactor.

16. The plasma reactor apparatus for producing nano-powder as set forth in claim 5, further comprising:

a lower body mounted under the upper body;

wherein the lower body having a reaction pipe receiving a reactor communicating with the reactor of the upper body, a high-frequency coil surrounding the periphery of the reaction pipe, and a ceramic inner wall provided inside the reaction pipe, the reactor of the lower body having a diameter larger than that of the reactor of the upper body, the high frequency coil of the lower body having a capacity larger than that of the high frequency coil of the upper body, the ceramic inner wall being formed with a plurality of gas passing bores and defining a gas movement passage with the reaction pipe therebetween for allowing the inflow of argon gas from the outside into the reactor.

* * * * *